United States Patent
Latham et al.

(10) Patent No.: US 6,492,853 B1
(45) Date of Patent: Dec. 10, 2002

(54) MASTER/SLAVE METHOD FOR A ZQ-CIRCUITRY IN MULTIPLE DIE DEVICES

(75) Inventors: Scott Latham, Los Altos, CA (US); Sunil Koduru, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/022,880

(22) Filed: Dec. 13, 2001

(51) Int. Cl.[7] .................................................. H03K 3/12
(52) U.S. Cl. .......................................... 327/199; 326/37
(58) Field of Search .................................. 327/100, 199, 327/200, 334; 326/37, 38

(56) References Cited

U.S. PATENT DOCUMENTS 6,057,705 A * 5/2000 Wojewoda et al. ............ 326/38

* cited by examiner

*Primary Examiner*—Kenneth B. Wells
(74) *Attorney, Agent, or Firm*—Christopher P. Maiorana, P.C.

(57) ABSTRACT

An apparatus including a first circuit and a second circuit. The first circuit may be configured to generate one or more first control signals in response to a reference impedance. The second circuit may be configured to operate in (i) a first mode in response to a first state of a second control signal and (ii) a second mode in response to a second state of the second control signal. When the second circuit is in the first mode, an output impedance of the second circuit may be adjusted in response to the one or more first control signals and the one or more first control signals may be presented at a first input/output of the second circuit. When the second circuit is in the second mode, the output impedance of the second circuit may be adjusted in response to one or more third control signals received at a second input/output of the second circuit.

15 Claims, 5 Drawing Sheets

US 6,492,853 B1

MASTER/SLAVE METHOD FOR A ZQ-CIRCUITRY IN MULTIPLE DIE DEVICES

FIELD OF THE INVENTION

The present invention relates to a method and/or architecture for implementing a programmable impedance generally and, more particularly, to a method and/or architecture for implementing a common programmable impedance pin for monolithic devices that may be used by at least two dies that each have separate programmable impedance circuitry.

BACKGROUND OF THE INVENTION

Conventional ZQ-technology provides programmable impedance for single dies. Conventional single-die ZQ-circuitry does not allow for easy expansion by multiple die techniques, such as die stacking. Connecting the ZQ pad of all the dies in a package to a single pin drives current into all the pins. The current causes deviation from the resistance value on a single die, which would typically be in the range of 5 times the required impedance. Moreover, the circuitry on each of the dies responds at different times causing the effective output impedance to change erroneously.

Referring to FIG. 1, a typical single-die ZQ-technology programmable impedance circuit 10 is shown. The circuit 10 illustrates a programmable impedance architecture for QDR™ SRAMs (QDR™ is a trademark of Cypress Semiconductor, Inc., San Jose, Calif.). The circuit 10 includes a circuit 12 and a circuit 14. The circuit 12 has an input 16 that receives the signal ZQPAD. The circuit 12 also has an output 18 that presents the signal ZQCLK, an output 20 that presents the signal ZQLOAD and an output 22 that presents the signal ZQDATA. The circuit 14 has an input 24 that receives the signal ZQCLK, an input 26 that receives the signal ZQLOAD and an input 28 that receives the signal ZQDATA. The circuit 14 also has an output 30 that presents the signal O/P_PAD. The circuit 10 provides programmable impedance for a single die.

A designer typically chooses a resistive value to program the impedance of a die by selecting a resistor that is five times the desired impedance value. The resistor is connected between ground and the pad ZQPAD. The ZQ circuitry 12 sends out a current and measures the resulting voltage on the pad ZQPAD. Based on the result, the ZQ-circuit 12 sends three signals (ZQCLK, ZQLOAD, and ZQDATA) to, the programmable output drivers 14. Such a configuration may allow the designer to match the output impedance of the device to the transmission line impedance on a printed circuit board, resulting in improved signal integrity. The drivers 14 use the data in the ZQ-signals to set the impedance of the signal O/P PAD.

It is generally desirable to implement ZQ-technology to implement a common programmable impedance pin for multiple-die implementations within the same package.

SUMMARY OF THE INVENTION

The present invention concerns an apparatus comprising a first circuit and a second circuit. The first circuit may be configured to generate one or more first control signals in response to a reference impedance. The second circuit may be configured to operate in (i) a first mode in response to a first state of a second control signal and (ii) a second mode in response to a second state of the second control signal. When the second circuit is in the first mode, an output impedance of the second circuit may be adjusted in response to the one or more first control signals and the one or more first control signals may be presented at a first input/output of the second circuit. When the second circuit is in the second mode, the output impedance of the second circuit may be adjusted in response to one or more third control signals received at a second input/output of the second circuit.

The objects, features and advantages of the present invention include providing a method and/or architecture for implementing a common programmable impedance pin for monolithic devices that may be used by at least two dies that each have separate programmable impedance circuitry that may (i) allow many device dies to be stacked together in the same package, (ii) keep existing pin configurations constant, (iii) allow programmable output impedance for stacked dies, and/or (iv) allow ease of expansion.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Multiple-die devices may be implemented by stacking two or more device dies (e.g., memories) on top of each other to create a larger device (or memory) in a single package. For example, by stacking two 256K×16 memories a 256K×32 memory or a 512K×16 memory may be created. For the new device to remain in the same package, the 512K×16 configuration is used. The 256K×32 configuration may require bonding out of 16 additional data lines, while the 512K×16 requires only one additional address pin (e.g., to select which memory die will be accessed).

In circuit design, it is desirable to keep the pin configurations between a one-die device and a multiple-die device consistent. The multiple dies may share the data lines. However, it may be impossible to have two ZQ pins on the package controlling one data line. In addition, bonding out another ZQ pin would deviate from the original pin configuration. Since conventional ZQ-circuitry is designed to feed a current into the ZQ pin and then measure the corresponding voltage, it is not possible to connect both dies to the one ZQ pin. In such a configuration, the ZQ-circuitry in each device may become misconfigured. In particular, with two dies connected to one pin, the voltage generated would generally be cut in half and the output impedance may attain a different value than that which was intended by the system designer.

Figure 1:
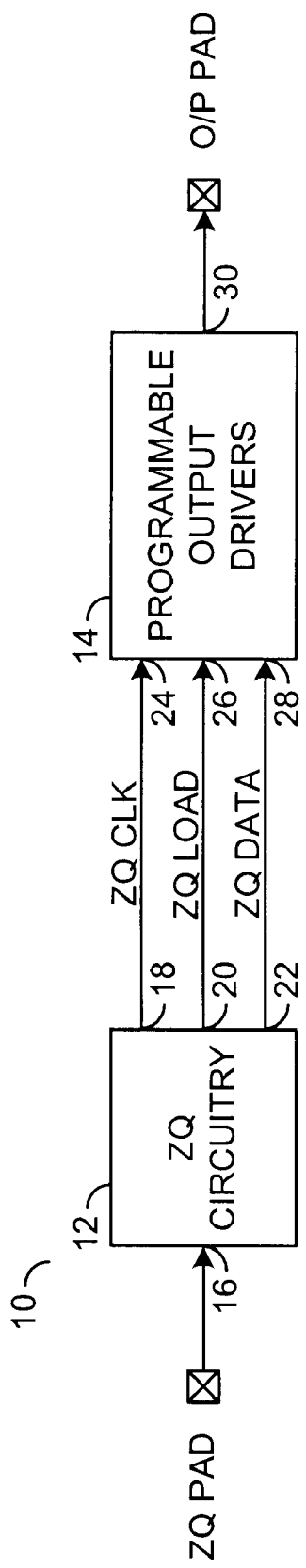
FIG. 1 is a block diagram of a typical programmable impedance device.
Figure 2:
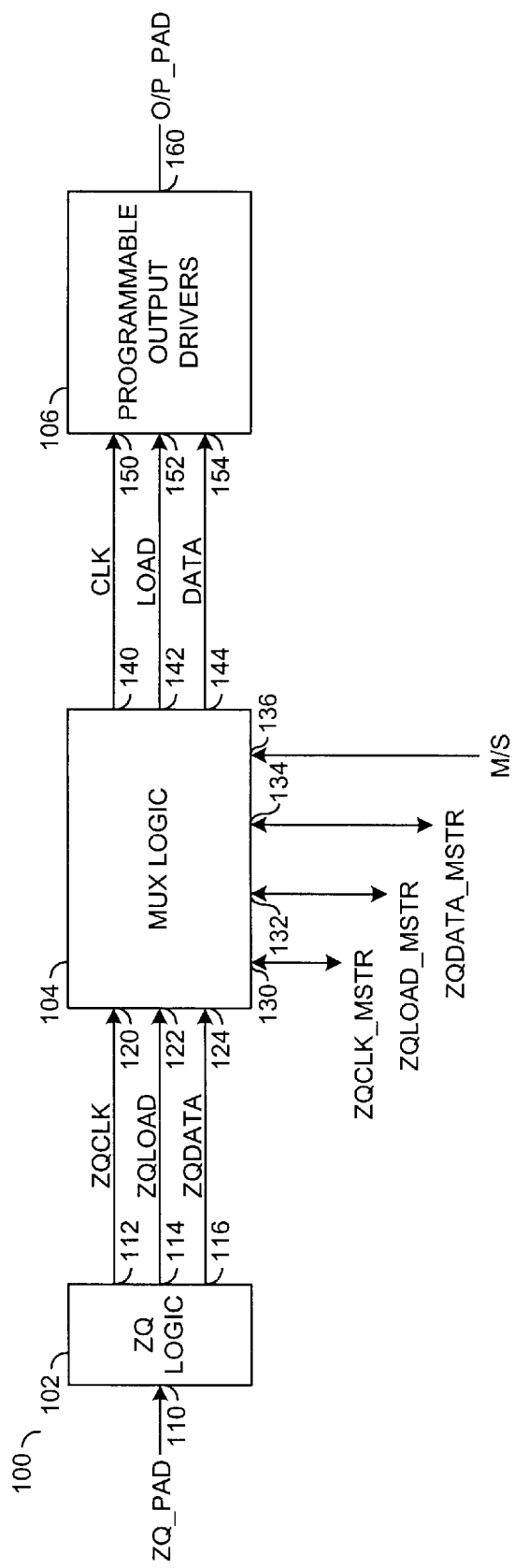
FIG. 2 is a block diagram of a preferred embodiment of the present invention.

Referring to FIG. 2, a block diagram of a circuit 100 is shown in accordance with a preferred embodiment of the present invention. The circuit 100 may implement a common programmable impedance pin for monolithic devices that may be used by at least two dies that each have separate programmable impedance circuitry (e.g., "ZQ-circuitry").

The circuit 100 generally comprises a block (or circuit) 102, a block (or circuit) 104 and a block (or circuit) 106. The circuit 102 may be implemented as a ZQ logic circuit. The circuit 104 may be implemented as a multiplexer logic circuit. The circuit 106 may be implemented as a programmable output drivers circuit. The circuit 102 may have an input 110 that may receive a signal (e.g., ZQ_PAD), an output 112 that may present a signal (e.g., ZQCLK), an output 114 that may present a signal (e.g., ZQLOAD), and an output 116 that may present a signal (e.g., ZQDATA). The signal ZQCLK may be implemented as a clock signal. The signal ZQLOAD may be implemented as a control signal. The signal ZQDATA may be comprise data for controlling an impedance of the circuit 100. The signal ZQDATA may be implemented, in one example, as a multi-bit signal. In one example, the signal ZQDATA may be a serial (multiplexed) signal.

The circuit 104 may have an input 120 that may receive the signal ZQCLK, an input 122 that may receive the signal ZQLOAD, an input 124 that may receive the signal ZQDATA, an input/output 130 that may receive/present a signal (e.g., ZQCLK_MSTR), an input/output 132 that may receive/present a signal (e.g., ZQLOAD_MSTR), an input/output 134 that may receive/present a signal (e.g., ZQDATA_MSTR), and an input 136 that may receive a signal (e.g., M/S). The circuit 104 may also have an output 140 that may present a signal (e.g., CLK), an output 142 that may present a signal (e.g., LOAD), and an output that may present a signal (e.g., DATA). The circuit 104 may be configured to operate in a first mode (e.g., a master mode) in response to a first state (e.g., a logical HIGH, or "1") of the signal M/S and a second mode (e.g., a slave mode) in response to a second state (e.g., a logical LOW, or "0") of the signal M/S. Alternatively, the first state of the signal M/S may correspond to the input 136 being allowed to float.

When the circuit 104 is operating in the master mode, the circuit 104 may be configured to present (i) the signal ZQCLK as the signals CLK and ZQCLK_MSTR, (ii) the signal ZQLOAD as the signals LOAD and ZQLOAD_MSTR, and (iii) the signal ZQDATA as the signals DATA and ZQDATA_MSTR. When the circuit 104 is operating in the slave mode, (i) the signals ZQCLK, ZQLOAD, and ZQDATA are generally ignored and (ii) the signals ZQCLK_MSTR, ZQLOAD_MSTR, and ZQDATA_MSTR are generally presented as the signals CLK, LOAD, and DATA, respectively. When the circuit 104 is in the master mode, the circuit 100 is generally the source of the signals ZQCLK_MSTR, ZQLOAD_MSTR, and ZQDATA_MSTR. When the circuit 104 is in the slave mode, the circuit 100 is generally the recipient of the signals ZQCLK_MSTR, ZQLOAD_MSTR, and ZQDATA_MSTR.

The circuit 106 may have an input 150 that may receive the signal CLK, an input 152 that may receive the signal LOAD, an input 154 that may receive the signal DATA, and an output 160 that may present a signal (e.g., O/P_PAD). The circuit 106 may be configured to control an impedance of the signal O/P_PAD in response to the signals CLK, LOAD, and DATA.

Figure 3:
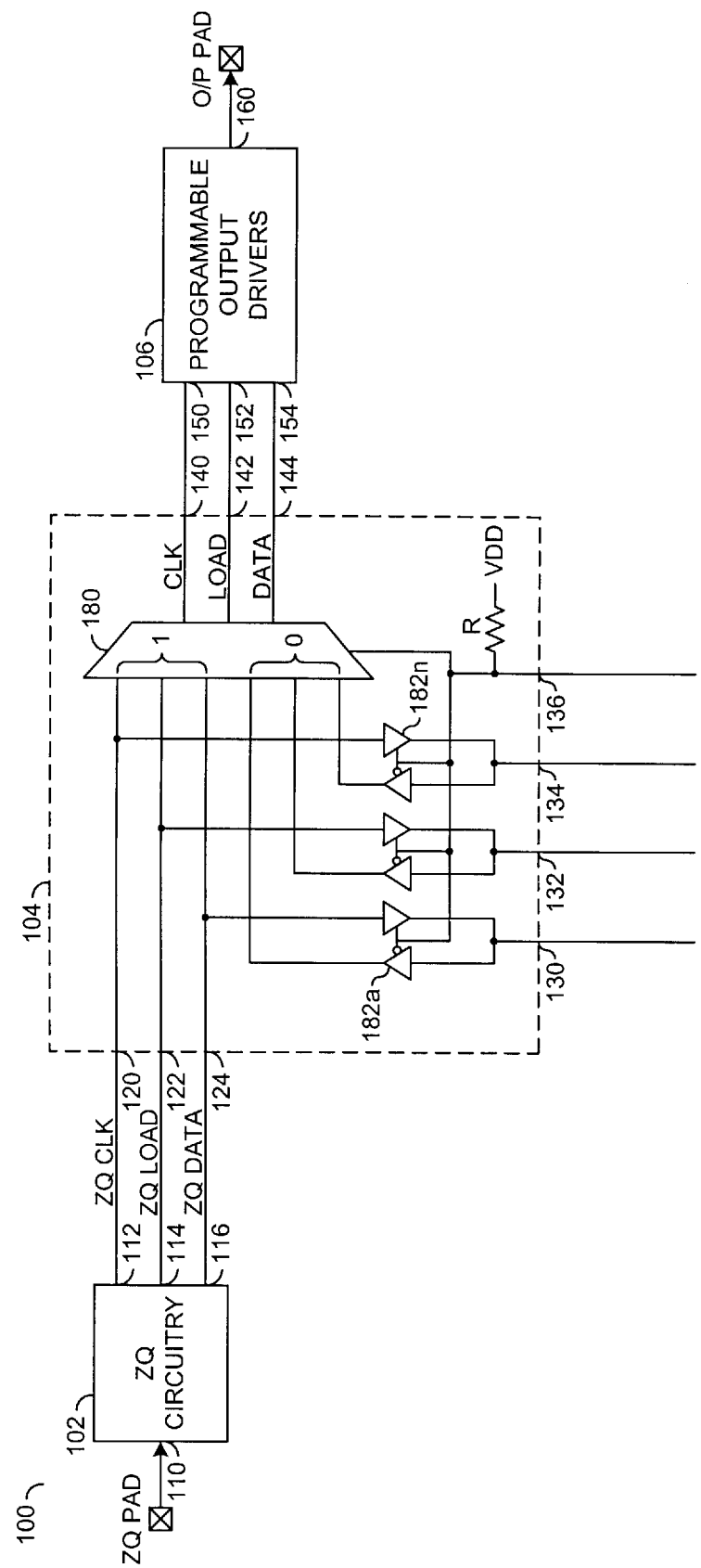
FIG. 3 is a detailed block diagram of the circuit of FIG. 2.

Referring to FIG. 3, a more detailed diagram of the system 100 is shown. The circuit 104 generally comprises a multiplexer 180 and a number of gates 182a–182n. In one example, the multiplexer 180 may be configured as a 2:1 channel multiplexer (e.g., 3-input/channel, 3-output). A first channel of the multiplexer 180 may be configured to receive the signal ZQCLK, the signal ZQLOAD and the signal ZQDATA. A second channel of the multiplexer 180 may be coupled to outputs of the gates 182a–182n. The gates 182a–182n may also have inputs that may be coupled to the signals ZQCLK, ZQLOAD, ZQDATA. The gates 182a–182n may have input/outputs that may be coupled to the signals ZQCLK_MSTR, ZQLOAD_MSTR, and ZQDATA_MSTR. A control input of the gates 182a–182n may receive the signal MIS. The gates 182a–182n may be configured as bi-directional buffer/drivers. In one example, the buffers 182a–182n may be implemented with pass-gates. The buffers 182a–182n may be controlled by the signal M/S. The signal M/S may be configured as a master/slave select signal. The signal M/S generally controls a direction in which the gates 182a–182n conduct a signal. The signal MIS may be presented to a control input of the multiplexer 180. In one example, the signal M/S may be biased to a default state by a pull-up resistor R.

Figure 4:
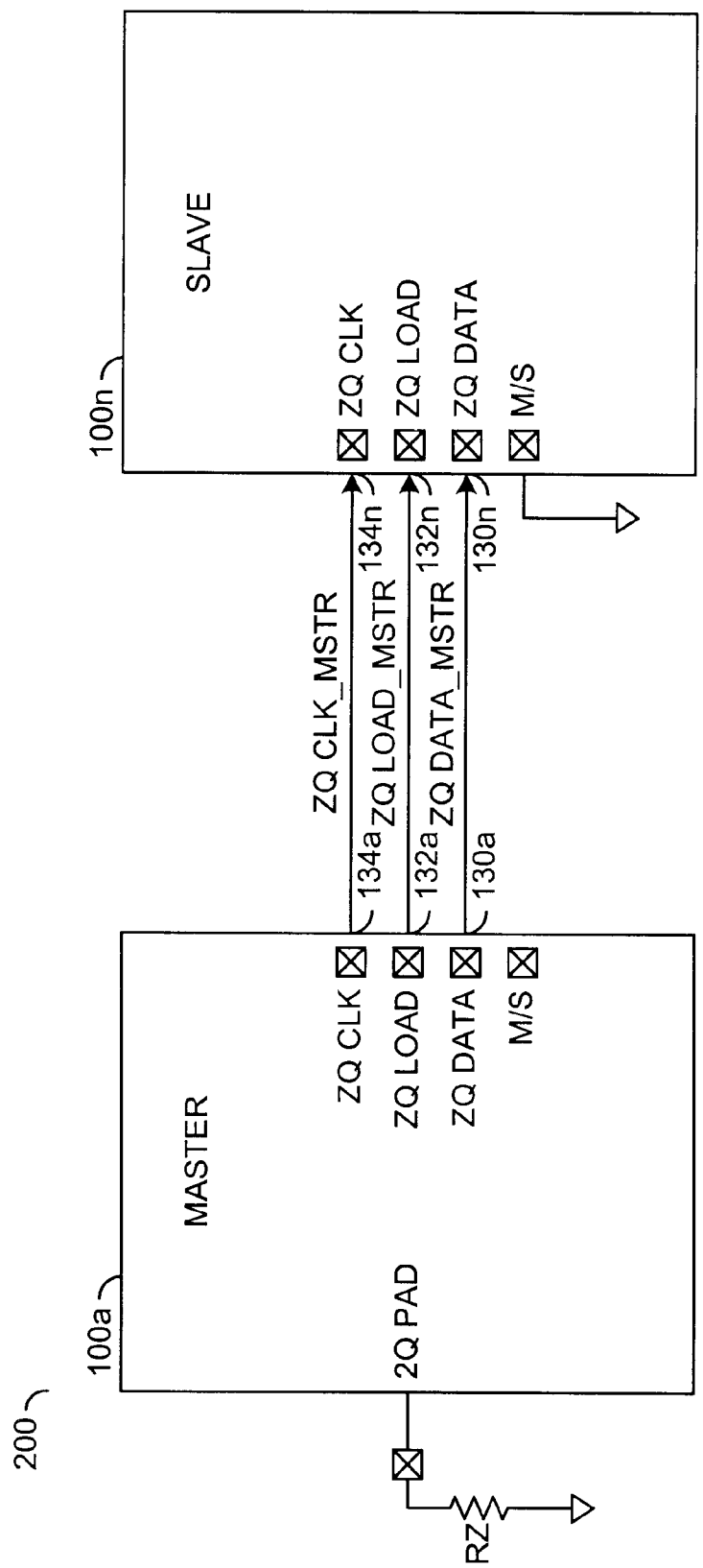
FIG. 4 is a block diagram illustrating an implementation of the present invention.

Referring to FIG. 4, a system 200 is shown illustrating a number of circuits 100a–110n connected in accordance with the present invention. The circuit 10a–100n may be implemented similarly to the circuit 100 of FIGS. 2 and 3. The circuit 100a may be configured as a master device. The circuit 100n may be configured as the slave device. The master device 100a and the slave device 100n may share the signals ZQCLK_MSTR, ZQLOAD_MSTR and ZQDATA_MSTR. The signal M/S may be implemented as a power supply ground potential to indicate a slave configuration. The master device may have the ability to look at the package ZQ pin and control the impedance of the data lines of the master device and the slave device. The slave die may defer to the master die, and the slave ZQ-circuitry may be ignored.

The circuits 100a –100n may make use of the three ZQ circuit signals ZQCLK, ZQLOAD, and ZQDATA. The die 100a may be set as the "master", while the other die or dies 100n may act as the "slave". The die 100a may have the ZQ signals forwarded on to the output drivers and also to the output drivers of the slave 100n. In such a configuration, the ZQ signals of the slave 100n are generally ignored. The pins 130, 132 and 134 may be bi-directional. The multiplexer 180, depending on the state of the signal M/S, will either allow or not allow the ZQ-signals (e.g., ZQCLKi, ZQLOADi, and ZQDATAi) generated on a particular die to propagate to the output drivers 106i.

Figure 5:
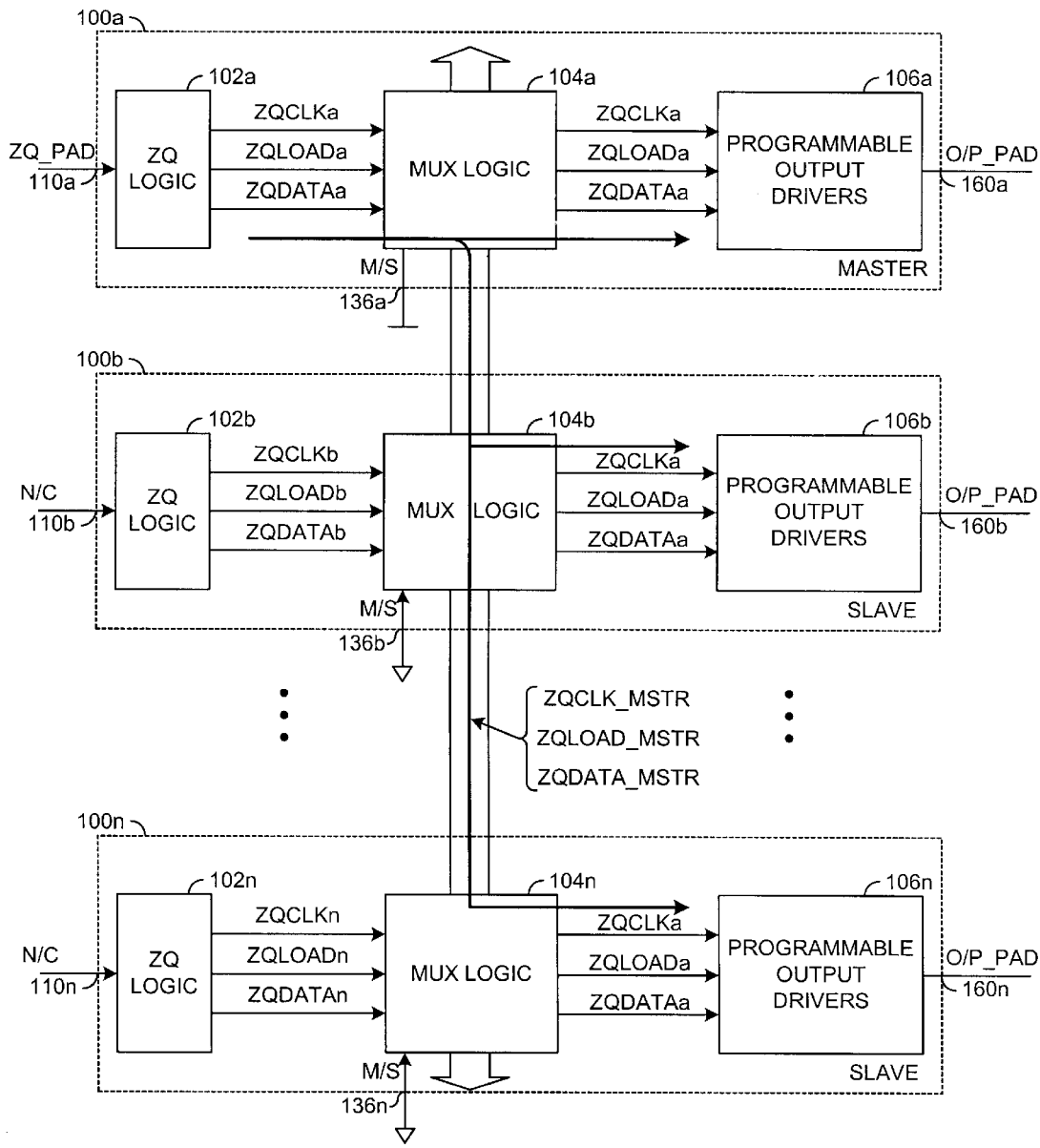
FIG. 5 is a block diagram illustrating an example signal path in accordance with the present invention.

Referring to FIG. 5, a block diagram of a system 300 is shown illustrating an example signal path in accordance with the present invention. The master die 100a may have the signal M/S tied HIGH or left floating. The slave die 100b–100n may have the signal M/S pulled LOW. The ZQ-circuitry 102a of the master die may measure the voltage from the ZQPAD and place the appropriate data on the lines ZQCLK_MSTR, ZQLOAD_MSTR, and ZQDATA_MSTR. The master multiplexer 104a may allow the ZQ signals to pass to the programmable output drivers circuit 106a of the master die. The slave dies 100b–100n are generally not connected to the package ZQPAD to avoid erroneous voltage readings. The ZQ signals that are generated by the slave dies 100b–100n may be ignored.

The ZQ signals ZQCLKa, ZQLOADa and ZQDATAa that are placed onto the output pads of the master die 100a are passed as the signals ZQCLK_MSTR, ZQLOAD_MSTR and ZQDATA_MSTR to the slave dies 100b–100n. The slave dies with the signal M/S set to 0 pass the signals ZQCLK_MSTR, ZQLOAD_MSTR and ZQDATA_MSTR to the programmable output drivers circuits 106b–106n. Since the output drivers 106a–106n for each die 100a–100n generally contain the same ZQ-information (e.g., the signals ZQCLKa, ZQLOADa, ZQDATAa), the dies 100a–100n generally set the outputs 160a–160n to the same output impedance value.

A package substrate of the present invention is generally designed such that the ZQPAD of the master die 100a is connected to the package pin and the ZQPAD of the slave dies 100b–100n are left unconnected. The package is generally configured to accommodate the interconnection between the master die and the slave die(s).

The present invention may be implemented with two dies or generalized to account for n dies (where n is an integer), as long as one die is assigned as the master and all the others as slaves.

The present invention may be used in the same manner as the previous single-die ZQ circuitry described in the background section. In monolithic devices, keeping the same package and pin configurations but containing extra memory for expansion is generally desirable. The present invention may be inconspicuous to the user. Furthermore, when the present invention is used as a single die device, the four pins are generally left unconnected.

The present invention may allow for many device dies to be stacked together in the same package, while keeping existing pin configurations constant. Without the present invention, stacking dies together while keeping the programmable output impedance feature functioning properly would be difficult. The present invention allows ease of expansion.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to generate one or more first control signals in response to a reference impedance; and
    a second circuit configured to operate in (i) a first mode in response to a first state of a second control signal and (ii) a second mode in response to a second state of said second control signal, wherein:
        when in said first mode, (i) an output impedance of said second circuit. is adjusted in response to said one or more first control signals and (ii) said one or more first control signals are presented at a first input/output of said second circuit, and
        when in said second mode, said output impedance of said second circuit is adjusted in response to one or more third control signals received at a second input/output of said second circuit.

2. The apparatus according to claim 1, wherein said apparatus further comprises a plurality of second circuits connected in a master/slave configuration.

3. The apparatus according to claim 2, wherein each of said plurality of second circuits is fabricated on a separate die.

4. The apparatus according to claim 1, wherein said first circuit comprises:
    ZQ circuitry configured to generate said one or more first control signals.

5. The apparatus according to claim 1, wherein said one or more first control signals comprise programmable impedance signals.

6. The apparatus according to claim 1, wherein said second circuit comprises a multiplexer.

7. The apparatus according to claim 6, further comprising one or more pass gates connected to said multiplexer.

8. The apparatus according to claim 7, wherein said one or more first control signals are presented to an input of said pass gates.

9. The apparatus according to claim 7, wherein said one or more third control signals are presented to an output of said pass gates.

10. An apparatus comprising:
    means for generating one or more first control signals in response to a reference impedance; and
    means for controlling an output impedance (i) in response to said one or more first control signals when a second control signal is in a first state and (ii) in response to one or more third control signals when said second control signal is in a second state.

11. The apparatus according to claim 10, further comprising:
    means for presenting said one or more first control signals to an input/output in response to said first state of said second control signal; and
    means for receiving said one or more third control signals in response to said second state of said second control signal.

12. A method of programming an output impedance comprising the steps of:
    generating one or more first control signals in response to a reference impedance;
    controlling an output impedance in response to said one or more first control signals when a second control signal is in a first state; and
    controlling said output impedance in response to one or more third control signals when said second control signal is in a second state.

13. The method according to claim 12, further comprising the step of:
    presenting said one or more first control signals to an input/output in response to said first state of said second control signal.

14. The method according to claim 13, further comprising the step of:
    receiving said one or more third control signals in response to said second state of said second control signal.

15. The method according to claim 14, further comprising the step of multiplexing said one or more first control signals and said one or more third control signals in response to said second control signal.

* * * * *